(12) United States Patent
Chou et al.

(10) Patent No.: US 11,664,450 B2
(45) Date of Patent: May 30, 2023

(54) HIGH VOLTAGE SEMICONDUCTOR DEVICE

(71) Applicant: UNITED MICROELECTRONICS CORP., Hsin-Chu (TW)

(72) Inventors: Ling-Chun Chou, Tainan (TW); Te-Chi Yen, Tainan (TW); Yu-Hung Chang, Tainan (TW); Kun-Hsien Lee, Tainan (TW); Kai-Lin Lee, Kinmen County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 35 days.

(21) Appl. No.: 17/216,642

(22) Filed: Mar. 29, 2021

(65) Prior Publication Data

US 2022/0271161 A1   Aug. 25, 2022

(30) Foreign Application Priority Data

Feb. 19, 2021   (CN) .......................... 202110191369.5

(51) Int. Cl.
  *H01L 29/78*   (2006.01)
  *H01L 29/06*   (2006.01)
  *H01L 29/08*   (2006.01)

(52) U.S. Cl.
  CPC ...... *H01L 29/7835* (2013.01); *H01L 29/0653* (2013.01); *H01L 29/086* (2013.01); *H01L 29/0878* (2013.01)

(58) Field of Classification Search
  CPC ... H01L 29/1095; H01L 29/0615–0634; H01L 29/1083; H01L 29/0873–0882; H01L 29/0856–0865; H01L 29/0653; H01L 29/7835; H01L 29/7816; H01L 29/66681
  See application file for complete search history.

(56) References Cited

U.S. PATENT DOCUMENTS 5,420,061 A * 5/1995 Manning ............. H01L 27/0921
                                                          257/E21.549
6,924,531 B2 * 8/2005 Chen .................... H01L 29/1083
                                                          257/E29.268
7,608,513 B2 * 10/2009 Yang ................. H01L 29/66659
                                                          438/286

(Continued)

FOREIGN PATENT DOCUMENTS

CN          107910358 B  *  9/2020   ......... H01L 29/0684
WO   WO-2019007331 A1 *  1/2019   ............. H01L 29/06

*Primary Examiner* — Errol V Fernandes
*Assistant Examiner* — Jeremy J Joy
(74) *Attorney, Agent, or Firm* — Winston Hsu

(57) ABSTRACT

A high voltage semiconductor device includes a semiconductor substrate, first and second deep well regions, and first and second well regions disposed in the semiconductor substrate. The second deep well region is located above the first deep well region. The first well region is located above the first deep well region. The second well region is located above the second deep well region. A conductivity type of the second deep well region is complementary to that of the first deep well region. A conductivity type of the second well region is complementary to that of the first well region and the second deep well region. A length of the second deep well region is greater than or equal to that of the second well region and less than that of the first deep well region. The first well region is connected with the first deep well region.

12 Claims, 16 Drawing Sheets

(56) References Cited

U.S. PATENT DOCUMENTS

| | | | | |
|---|---|---|---|---|
| 7,795,674 B2* | 9/2010 | Yang | .................... | H01L 29/7835 257/E29.256 |
| 8,431,990 B2* | 4/2013 | Lee | ..................... | H01L 29/0634 257/213 |
| 8,592,905 B2 | 11/2013 | Pu | | |
| 9,093,296 B2* | 7/2015 | Kao | .................... | H01L 29/0653 |
| 9,508,845 B1* | 11/2016 | Lin | ..................... | H01L 29/7835 |
| 2006/0261408 A1* | 11/2006 | Khemka | ............... | H01L 29/063 257/E29.328 |
| 2007/0264785 A1* | 11/2007 | Choi | ................. | H01L 29/66674 257/E29.066 |
| 2008/0166849 A1* | 7/2008 | Yang | .................... | H01L 29/1083 438/305 |
| 2008/0182394 A1* | 7/2008 | Yang | ................. | H01L 29/66659 438/510 |
| 2008/0237704 A1* | 10/2008 | Williams | ............. | H01L 29/7835 257/E21.546 |
| 2010/0025765 A1* | 2/2010 | Yang | .................... | H01L 29/402 257/E29.256 |
| 2013/0093010 A1* | 4/2013 | Huang | ................ | H01L 29/7816 257/E29.256 |
| 2015/0041890 A1* | 2/2015 | Campi, Jr. | ............ | H01L 21/761 257/339 |
| 2015/0236150 A1* | 8/2015 | Chen | ..................... | H01L 29/402 327/109 |
| 2016/0155795 A1* | 6/2016 | Feng | .................... | H01L 29/1083 438/279 |
| 2017/0263717 A1* | 9/2017 | Lin | ....................... | H01L 29/402 |
| 2017/0263761 A1* | 9/2017 | Hu | ....................... | H01L 29/7816 |
| 2018/0006149 A1* | 1/2018 | Kim | ................... | H01L 29/7816 |
| 2018/0130903 A1* | 5/2018 | Lin | ....................... | H01L 21/761 |
| 2018/0182747 A1* | 6/2018 | Kim | ............ | H01L 21/823892 |
| 2019/0067471 A1* | 2/2019 | Huang | ................ | H01L 29/0882 |
| 2021/0104630 A1* | 4/2021 | Chung | ................ | H01L 29/0856 |
| 2021/0366900 A1* | 11/2021 | Kaneda | ............ | H01L 21/26513 |
| 2021/0391451 A1* | 12/2021 | Chen | .................... | H01L 29/1095 |

\* cited by examiner

HIGH VOLTAGE SEMICONDUCTOR DEVICE

BACKGROUND OF THE INVENTION

1. Field of the Invention

The present invention relates to a high voltage semiconductor device, and more particularly, to a high voltage semiconductor device including a deep well region.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operation voltage environment such as CPU power supply, power management system, AC/DC converter, and high-power or high frequency band power amplifier. The essential feature of LDMOS transistor device is a lateral-diffused drift region with low doping concentration and large area. The drift region is used to alleviate the high voltage between the drain and the source, and therefore LDMOS transistor device can have higher breakdown voltage. However, as the requirements of related products become higher and higher, how to improve the electrical performance, the voltage endurance and/or the reliability of high voltage semiconductor units through design modifications in the structure and/or the manufacturing process is still a continuous issue for those in the relevant fields.

SUMMARY OF THE INVENTION

A high voltage semiconductor device is provided in the present invention. Deep well regions having conductivity types complementary to each other are used to improve the electrical performance of the high voltage semiconductor device.

According to an embodiment of the present invention, a high voltage semiconductor device is provided. The high voltage semiconductor device includes a semiconductor substrate, a first deep well region, a second deep well region, a first well region, a second well region, and a gate structure. The first deep well region, the second deep well region, the first well region, and the second well region are disposed in the semiconductor substrate. The second deep well region is located above the first deep well region in a vertical direction, the first well region is located above the first deep well region in the vertical direction, and the second well region is located above the second deep well region in the vertical direction. A conductivity type of the second deep well region is complementary to a conductivity type of the first deep well region, a conductivity type of the second well region is complementary to a conductivity type of the first well region, and the conductivity type of the second well region is complementary to the conductivity type of the second deep well region. The gate structure is disposed on the semiconductor substrate, and a part of the first well region and a part of the second well region are located at two opposite sides of the gate structure in a horizontal direction respectively. A length of the second deep well region in the horizontal direction is greater than or equal to a length of the second well region in the horizontal direction and less than a length of the first deep well region in the horizontal direction, and the first well region is connected with the first deep well region.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
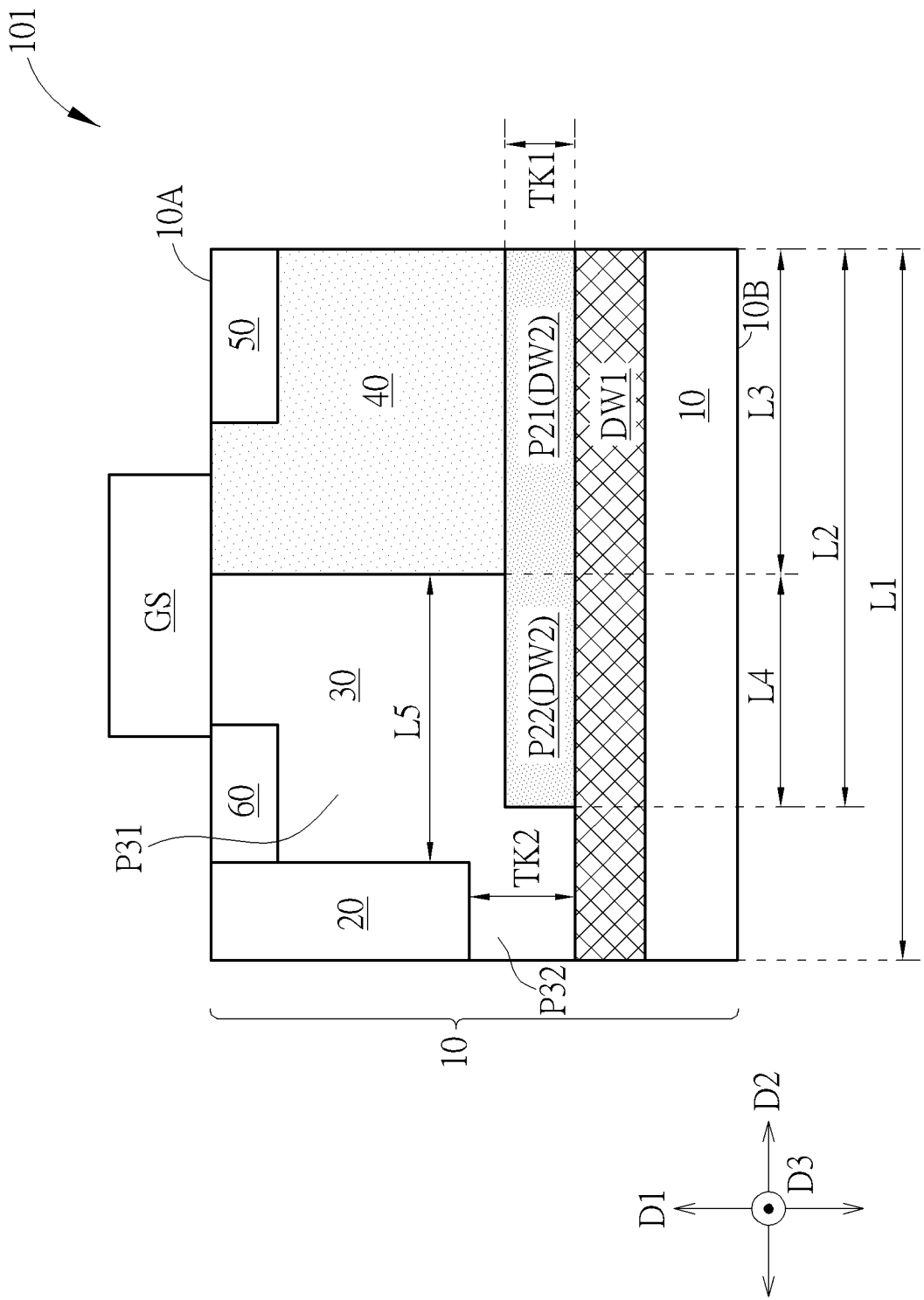
FIG. 1 is a schematic drawing illustrating a high voltage semiconductor device according to a first embodiment of the present invention.

Please refer to FIG. 1. FIG. 1 is a schematic drawing illustrating a high voltage semiconductor device 101 according to a first embodiment of the present invention. As shown in FIG. 1, the high voltage semiconductor device 101 includes a semiconductor substrate 10, a first deep well region DW1, a second deep well region DW2, a first well region 30, a second well region 40, and a gate structure GS. The first deep well region DW1, the second deep well region DW2, the first well region 30, and the second well region 40 are disposed in the semiconductor substrate 10. The second deep well region DW2 is located above the first deep well region DW1 in a vertical direction (such as a first direction D1 shown in FIG. 1), the first well region 30 is located above the first deep well region DW1 in the first direction D1, and the second well region 40 is located above the second deep well region DW2 in the first direction D1. A conductivity type of the second deep well region DW2 is complementary to a conductivity type of the first deep well region DW1, a conductivity type of the second well region 40 is complementary to a conductivity type of the first well region 30, and the conductivity type of the second well region 40 is complementary to the conductivity type of the second deep well region DW2. The gate structure GS is disposed on the semiconductor substrate 10, and a part of the first well region 30 and a part of the second well region 40 are located at two opposite sides of the gate structure GS in a horizontal direction (such as a second direction D2 shown in FIG. 1), respectively. A length L2 of the second deep well region DW2 in the second direction D2 is greater than or equal to a length L3 of the second well region 40 in the second direction D2 and less than a length L1 of the first deep well region DW1 in the second direction D2, and the first well region 30 is connected with the first deep well region DW1.

In some embodiments, a conductivity type of the semiconductor substrate 10 may be identical to the conductivity type of the first deep well region DW1, the second deep well region DW2 disposed between the second well region 40 and the first deep well region DW1 may be used to isolate the second well region 40 from the semiconductor substrate under the first deep well region DW1, and the first well region 30 connected with the first deep well region DW1 may be used to enhance related electrical performance of the high voltage semiconductor device, such as enhancing the breakdown voltage and/or reducing the drain-source on-state resistance (Ron), but not limited thereto. In other words, the related electrical performance of the high voltage semiconductor device may be improved without increasing the area occupied by the high voltage semiconductor device.

In some embodiments, the first direction D1 described above may be regarded as a thickness direction of the semiconductor substrate 10. The semiconductor substrate 10 may have a top surface 10A and a bottom surface 10B opposite to the top surface 10A in the first direction D1, and the gate structure GS may be disposed at a side of the top surface 10A, but not limited thereto. The horizontal directions substantially orthogonal to the first direction D1 (such as the second direction D2 and a third direction D3 shown in FIG. 1) may be substantially parallel with the top surface 10A and/or the bottom surface 10B of the semiconductor substrate 10, but not limited thereto. Additionally, in this description, a distance between the bottom surface 10B and a relatively higher location and/or a distance between the bottom surface 10B and a relatively higher part in the vertical direction (such as the first direction D1) is greater than a distance between the bottom surface 10B and a relatively lower location and/or a distance between the bottom surface 10B and a relatively lower part in the first direction D1. The bottom or a lower portion of each component may be closer to the bottom surface 10B of the semiconductor substrate 10 in the first direction D1 than the top or an upper portion of this component. Another component disposed above a specific component may be regarded as being relatively far from the bottom surface 10B of the semiconductor substrate 10 in the first direction D1, and another component disposed under a specific component may be regarded as being relatively closer to the bottom surface 10B of the semiconductor substrate 10 in the first direction D1.

In some embodiments, the high voltage semiconductor device 101 may further include a first isolation structure 20, a drain doped region 50, and a source doped region 60. The drain doped region 50, the source doped region 60, and at least a part of the first isolation structure 20 may be disposed in the semiconductor substrate 10. The drain doped region 50 may be located in the second well region 40, and the source doped region 60 and at least a part of the first isolation structure 20 may be located in the first well region 30. At least a part of the drain doped region 50 and at least a part of the source doped region 60 may be located at the two opposite sides of the gate structure GS in the horizontal direction (such as the second direction), respectively, and at least a part of the source doped region 60 may be located between the second well region 40 and at least a part of the first isolation structure 20 in the second direction D2.

In some embodiments, the semiconductor substrate 10 may include a silicon substrate, an epitaxial silicon substrate, a silicon germanium substrate, a silicon carbide substrate, a silicon-on-insulator (SOI) substrate, or a substrate formed of other suitable semiconductor materials and/or other suitable structures. In some embodiments, the first deep well region DW1, the second deep well region DW2, the first well region 30, the second well region 40, the drain doped region 50, and the source doped region 60 may include doped regions formed by doping processes (such as implantation processes) in the semiconductor substrate 10. In other words, the first deep well region DW1, the second deep well region DW2, the first well region 30, the second well region 40, the drain doped region 50, and the source doped region 60 may include a part of the semiconductor substrate 10 (i.e. having the same material with the semiconductor substrate 10) respectively and dopants formed in the semiconductor substrate 10. In some embodiments, the semiconductor substrate 10 may have a first conductivity type preferably or include a region having a first conductivity type, the first deep well region DW1 and the second well region 40 may have a second conductivity type, the second deep well region DW2 and the first well region 30 may have the first conductivity type, and the second conductivity type may be complementary to the first conductivity type. For example, the first conductivity type in this embodiment may be p-type, and the second conductivity type in this embodiment may be n-type, but not limited thereto. In other words, the semiconductor substrate 10 may be a p-type semiconductor substrate or a semiconductor substrate including a p-type doped region; the first deep well region DW1 may be an n-type doped deep well region; the second deep well region DW2 may be a p-type doped deep well region; the first region 30 may be a p-type doped well region; and the second well region 40 may be an n-type doped well region, but not limited thereto. Comparatively, in some embodiments, the first conductivity type may be n-type, and the second conductivity type may be p-type. Additionally, in some embodiments, the drain doped region 50 and the source doped region 60 may respectively include a second conductivity type heavily doped region, but the present invention is not limited to this.

In some embodiments, the first deep well region DW1 may contain a first impurity, the second deep well region DW2 may contain a second impurity, the first well region 30 may contain a third impurity, the second well region 40 may contain a fourth impurity, the drain doped region 50 may contain a fifth impurity, and the source doped region 60 may contain a sixth impurity. When the first conductivity type described above is p-type and the second conductivity type described above is n-type, the first impurity, the fourth impurity, the fifth impurity, and the sixth impurity may be n-type impurities, and the second impurity and the third impurity may be p-type impurities, but not limited thereto. The n-type impurities described above may include phosphorus (P), arsenic (As), or other suitable n-type impurity materials, and the p-type impurities described above may include boron (B), gallium (Ga), or other suitable p-type impurity materials. In other words, the impurities in the doped regions having the same conductivity type may be the impurities of the same type, and the same element or different elements may be used as the impurities in the doped regions having the same conductivity type according to some design considerations. Additionally, in some embodiments, the concentration of the fifth impurity in the drain doped region 50 and the concentration of the sixth impurity in the source doped region 60 may be higher than the concentration of the fourth impurity in the second well region 40; the concentration of the fourth impurity in the second well region 40 may be higher than the concentration of the first impurity in the first deep well region DW1; and the concentration of the third impurity in the first well region 30 may be higher than the concentration of the second impurity in the second deep well region DW2, but not limited thereto.

In some embodiments, the first isolation structure 20 may include a single layer or multiple layers of insulation materials, such as oxide insulation materials (silicon oxide, for example) or other suitable insulation materials. The gate structure GS may include a gate dielectric layer (not shown), a gate material layer (not shown) disposed on the gate dielectric layer, and a spacer (not shown) disposed on sidewalls of the gate material layer. The gate dielectric layer may include high dielectric constant (high-k) materials or other suitable dielectric materials (such as silicon oxide). The gate material layer may include non-metallic electrically conductive materials (such as doped polysilicon) or metal electrically conductive materials, such as a metal gate structure formed with a work function layer and a low electrical resistance layer stacked with each other, but not limited thereto. The high-k dielectric material described above may include hafnium oxide ($HfO_x$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k materials. The work function layer described above may include titanium nitride (TiN), titanium carbide (TiC), tantalum nitride (TaN), tantalum carbide (TaC), tungsten carbide (WC), titanium trialuminide ($TiAl_3$), aluminum titanium nitride (TiAlN), or other suitable electrically conductive work function materials. The low electrical resistivity layer described above may include tungsten, aluminum, copper, titanium aluminide, titanium, or other suitable low electrical resistivity materials. Additionally, the spacer described above may include a single layer or multiple layers of dielectric materials, such as silicon oxide, silicon nitride, silicon oxynitride, or other suitable dielectric materials.

In some embodiments, the second well region 40 may be regarded as a drift region in the high voltage semiconductor device, and when the high voltage semiconductor device 101 is viewed in the first direction D1, the gate structure GS may overlap a part of the first well region 30, a part of the drain doped region 60, and a part of the second well region 40, and the gate structure GS may not overlap the drain doped region 50, but not limited thereto. Additionally, in some embodiments, the first well region 30 may be directly connected with the first deep well region DW1 and the second deep well region DW2 respectively, and the second deep well region DW2 may be directly connected with the first deep well region DW1 and the second well region 40 respectively, but not limited thereto. In addition, the first well region 30 may be directly connected with the second well region 40 or a part of the semiconductor substrate 10 may be located between the first well region 30 and the second well region 40 according to some design considerations.

At least a part of the second deep well region DW2 (such as a first portion P21) may be disposed between the first deep well region DW1 and the second well region 40 in the first direction D1, and at least a part of the second deep well region DW2 (such as a second portion P22) may be disposed between the first deep well region DW1 and the first well region 30 in the first direction D1. Additionally, in some embodiments, a first portion P31 of the first well region 30 may be located between the second well region 40 and the first isolation structure 20 in the second direction D2, and a second portion P32 of the first well region 30 may be located between the first deep well region DW1 and the first isolation structure 20 in the first direction D1. In some embodiments, a length L5 of the first portion P31 of the first well region 30 in the second direction D2 may be greater than a length L4 of the second portion P22 of the second deep well region DW2 in the second direction D2, and a thickness TK2 of the second portion P32 of the first well region 30 may be greater than a thickness TK1 of the second deep well region DW2 for keeping the second deep well region DW2 from extending to the area under the first isolation structure 20 and keeping the second deep well region DW from being higher than the bottom surface of the first isolation structure 20. Accordingly, the influence of the second deep well region DW2 and/or the first isolation structure 20 on the connection between the first well region 30 and the first deep well region DW1 may be avoided. In addition, the thickness TK1 and the thickness TK2 described above may also be regarded as a length of the second deep well region DW2 in the first direction D1 and a length of the second portion P32 of the first well region 30 in the first direction D1, respectively.

Figure 2:
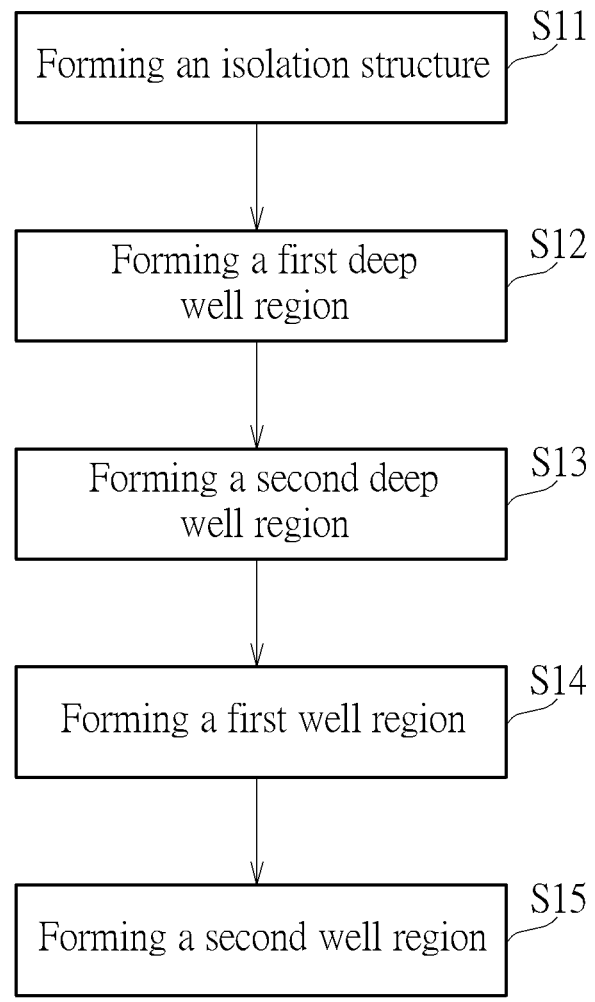
FIG. 2 is a schematic flow chart of a manufacturing method of a high voltage semiconductor device according to an embodiment of the present invention.

Please refer to FIG. 1 and FIG. 2. FIG. 2 is a schematic flow chart of a manufacturing method of a high voltage semiconductor device according to an embodiment of the present invention. In some embodiments, a manufacturing method of the high voltage semiconductor device 101 described above may include but is not limited to the steps shown in FIG. 2. As shown in FIG. 1 and FIG. 2, the manufacturing method of the high voltage semiconductor device 101 may include the following steps. Firstly, the step S11 is carried out for forming an isolation structure (such as the first isolation structure 20 described above) in the semiconductor substrate 10. Subsequently, the step S12 is carried out for forming the first deep well region DW1 in the semiconductor substrate 10. After the step of forming the first deep well region DW1, the step S13 is carried out for forming the second deep well region DW2 in the semiconductor substrate 10. After the step of forming the second deep well region DW2, the step S14 is carried out for forming the first well region 30 in the semiconductor substrate 10. After the step of forming the first well region 30, the step S15 is carried out for forming the second well region 40 in the semiconductor substrate 10. In some embodiments, a thermal treatment (such as a rapid thermal process, RTP) may be performed after the step of forming the second deep well region DW2 and before the step of forming the first well region 30 (i.e. between the step S13 and the step S14) for activating the first deep well region DW1 and/or the second deep well region DW2, but not limited thereto. In some embodiments, a thermal treatment may be performed after the step of forming the first deep well region DW1 and before the step of forming the second deep well region DW2 (i.e. between the step S12 and the step S13) for activating the first deep well region DW1 first and reducing the negative influence of the process of forming the second deep well region DW2 on the first deep well region DW1. After the step of forming the second well region 40, the gate structure GS described above may be formed on the semiconductor substrate 10, and the drain doped region 50 and the source doped region 60 described above may be formed in the semiconductor substrate 10. In addition, the sequence of the steps of forming the first deep well region DW1, the second deep well region DW2, the first well region 30, and the second well region 40 described above may also be applied to other embodiments of the present invention according to some considerations.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 3:
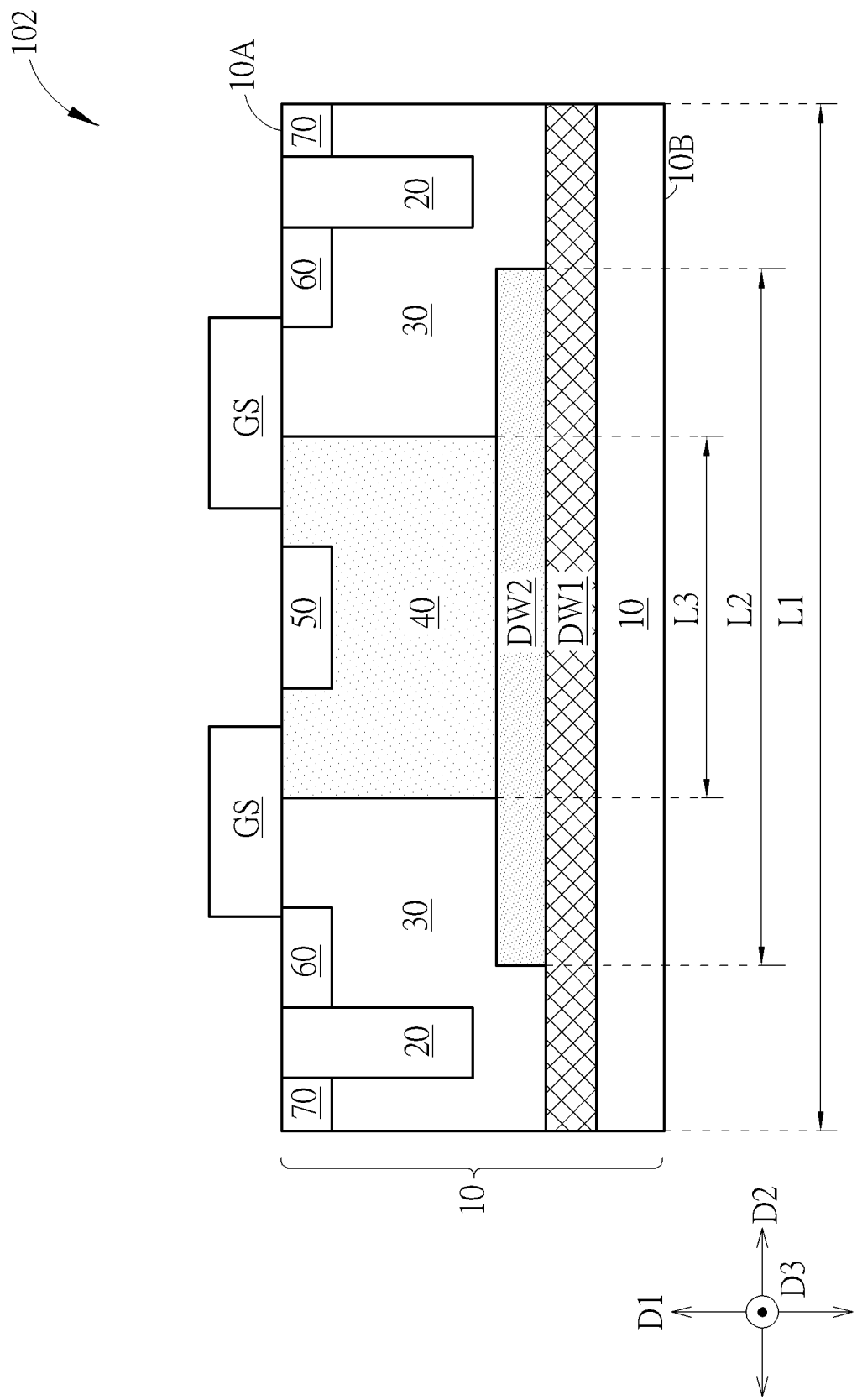
FIG. 3 is a schematic drawing illustrating a high voltage semiconductor device according to a second embodiment of the present invention.

Please refer to FIG. 3. FIG. 3 is a schematic drawing illustrating a high voltage semiconductor device 102 according to a second embodiment of the present invention. As shown in FIG. 3, the high voltage semiconductor device 102 may include two gate structures GS described above, two source doped regions 60 described above, and two first isolation structures 20 described above. The two gate structures GS, the two source doped regions 60, and the two first isolation structures 20 may be located at two opposite sides of the drain doped region 50 in the second direction D2, respectively. The first well region 30 may surround the second well region 40 in the second direction D2 and the third direction D3. In some embodiments, the second deep well region DW2 may cover the second well region 40 completely in the first direction D1 for ensuring the isolation effect of the second deep well region DW2 between the second well region 40 and the semiconductor substrate 10. In addition, the high voltage semiconductor device 102 may further include a doped region 70 disposed in the first well region 30, and a conductivity type of the doped region 70 may be complementary to the conductivity type of the source doped region 60. For instance, the doped region 70 may be a first conductivity type heavily doped region, and the doped region 70 may be used to adjust the electric potential of the first well region 30, but not limited thereto. Additionally, a part of the doped region 70 and the source doped region 60 may be disposed at two opposite sides of the first isolation structure 20 in the first direction D1, but not limited thereto.

Figure 4:
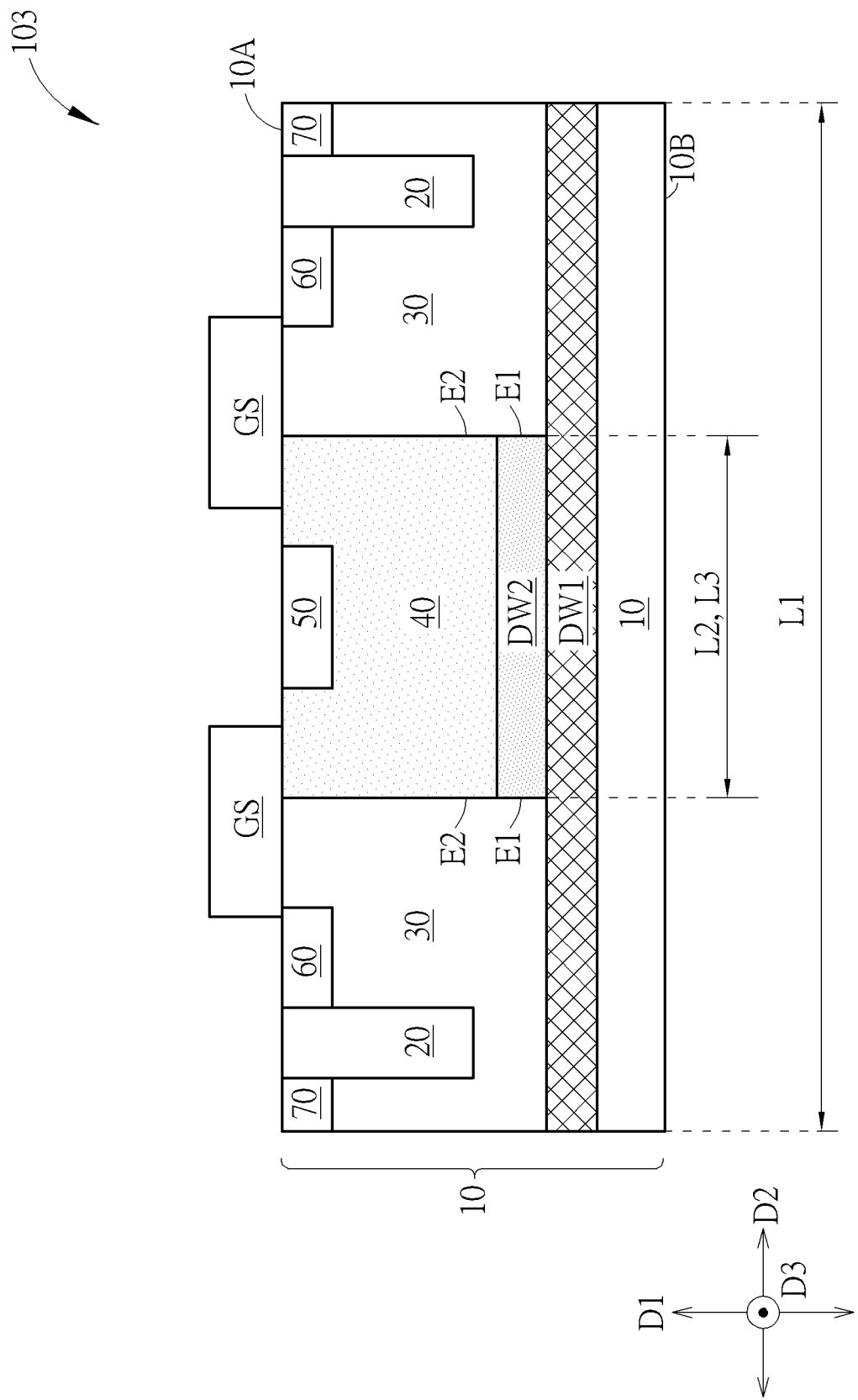
FIG. 4 is a schematic drawing illustrating a high voltage semiconductor device according to a third embodiment of the present invention.

Please refer to FIG. 4. FIG. 4 is a schematic drawing illustrating a high voltage semiconductor device 103 according to a third embodiment of the present invention. As shown in FIG. 4, in the high voltage semiconductor device 103, the length L2 of the second deep well region DW2 in the second direction D2 may be substantially equal to the length L3 of the second well region 40 in the second direction D2 and less than the length L1 of the first deep well region DW1 in the second direction D2. In some embodiments, considering feasible process variation control, the length L2 of the second deep well region DW2 in the second direction D2 may be substantially equal to the length L3 of the second well region 40 in the second direction D2 with a tolerance of ±10%, but not limited thereto. In some embodiments, two opposite edges of the second deep well region DW2 (such as two edges E1 opposite to each other in the second direction D2 and/or two edges opposite to each other in the third direction D3) may be aligned with two opposite edges of the second well region 40 (such as two edges E2 opposite to each other in the second direction D2 and/or two edges opposite to each other in the third direction D3) respectively. In some embodiments, a projection area of the second well region 40 in the first direction D1 may be substantially equal to a projection area of the second deep well region DW2 in the first direction D1. For example, the projection area of the second well region 40 in the first direction D1 may be substantially equal to the projection area of the second deep well region DW2 in the first direction D1 with a tolerance of ±10%, but not limited thereto.

Figure 5:
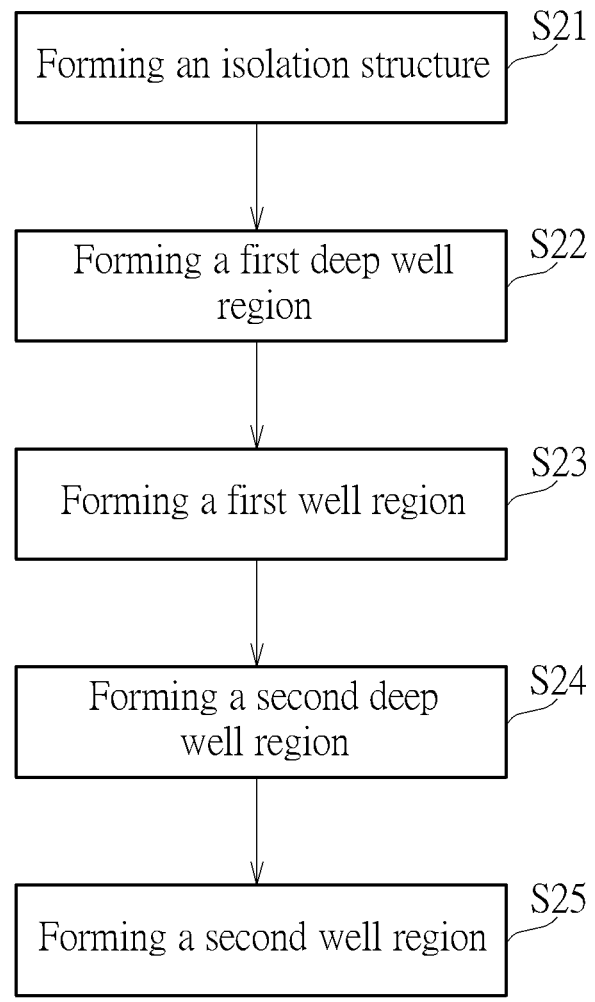
FIG. 5 is a schematic flow chart of a manufacturing method of a high voltage semiconductor device according to another embodiment of the present invention.

Please refer to FIG. 4 and FIG. 5. FIG. 5 is a schematic flow chart of a manufacturing method of a high voltage semiconductor device according to another embodiment of the present invention. In some embodiments, a manufacturing method of the high voltage semiconductor device 103 described above may include but is not limited to the steps shown in FIG. 5. As shown in FIG. 4 and FIG. 5, the manufacturing method of the high voltage semiconductor device 103 may include the following steps. Firstly, the step S21 is carried out for forming an isolation structure (such as the first isolation structure 20 described above) in the semiconductor substrate 10. Subsequently, the step S22 is carried out for forming the first deep well region DW1 in the semiconductor substrate 10. After the step of forming the first deep well region DW1, the step S23 is carried out for forming the first well region 30 in the semiconductor substrate 10. After the step of forming the first well region 30, the step S24 is carried out for forming the second deep well region DW2 in the semiconductor substrate 10. After the step of forming the second deep well region DW2, the step S25 is carried out for forming the second well region 40 in the semiconductor substrate 10. In some embodiments, the second deep well region DW2 and the second well region 40 may be respectively formed by different doping processes using the same patterned mask formed on the semiconductor substrate 10, the second well region 40 may be formed corresponding to the second deep well region DW2 in the first direction D1 accordingly, and the purpose of process simplification may be achieved accordingly, but not limited thereto. In addition, the sequence of the steps of forming the first deep well region DW1, the first well region 30, the second deep well region DW2, and the second well region 40 described above may also be applied to other embodiments of the present invention according to some considerations.

Figure 6:
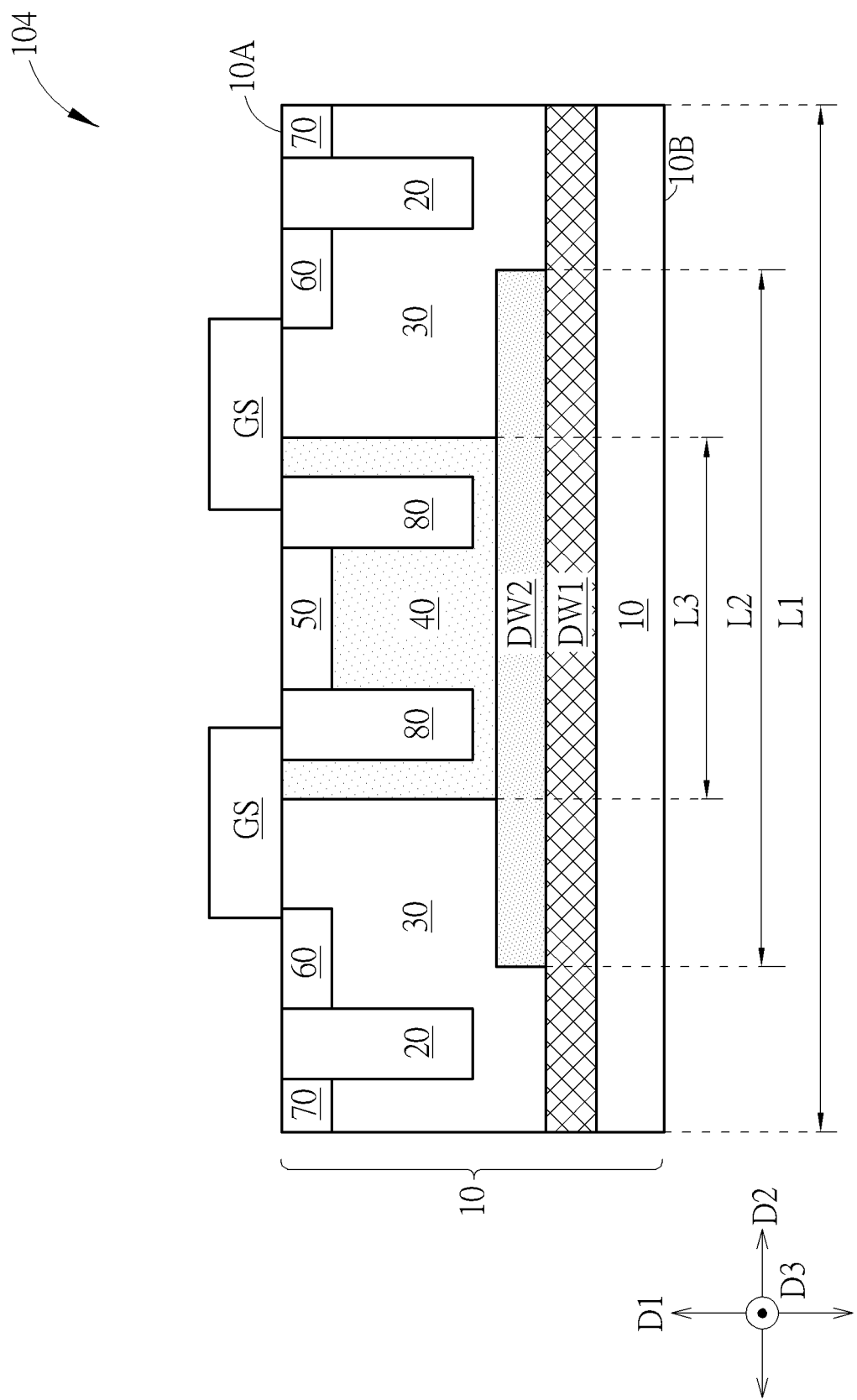
FIG. 6 is a schematic drawing illustrating a high voltage semiconductor device according to a fourth embodiment of the present invention.

Please refer to FIG. 6. FIG. 6 is a schematic drawing illustrating a high voltage semiconductor device 104 according to a fourth embodiment of the present invention. As shown in FIG. 6, the high voltage semiconductor device 104 may further include a second isolation structure 80 disposed in the second well region 40, at least a part of the second isolation structure 80 may be located between the first well region 30 and the drain doped region 50 in the second direction D2, and a part of the second well region 40 may be located between the second isolation structure 80 and the second deep well region DW2 in the first direction D1. In some embodiments, the second isolation structure 80 may include a single layer or multiple layers of insulation materials, such as oxide insulation materials (silicon oxide, for example) or other suitable insulation materials. In some embodiments, the second isolation structure 80 and the first isolation structure 20 may be formed concurrently by the same manufacturing process and have the same material composition and/or the same depth, but not limited thereto. In some embodiments, the first isolation structure 20 and the second isolation structure 80 may be formed by different processes and/or formed with different materials according to some design considerations. A greater depletion region may be generated by the disposition of the second isolation structure 80 for reducing the electric field effect and improving the electrical performance of the high voltage semiconductor device. For example, the breakdown voltage of the high voltage semiconductor device may be enhanced accordingly, but not limited thereto. It is worth noting that the second isolation structure 80 in this embodiment may also be applied to other embodiments of the present invention according to some considerations.

Figure 7:
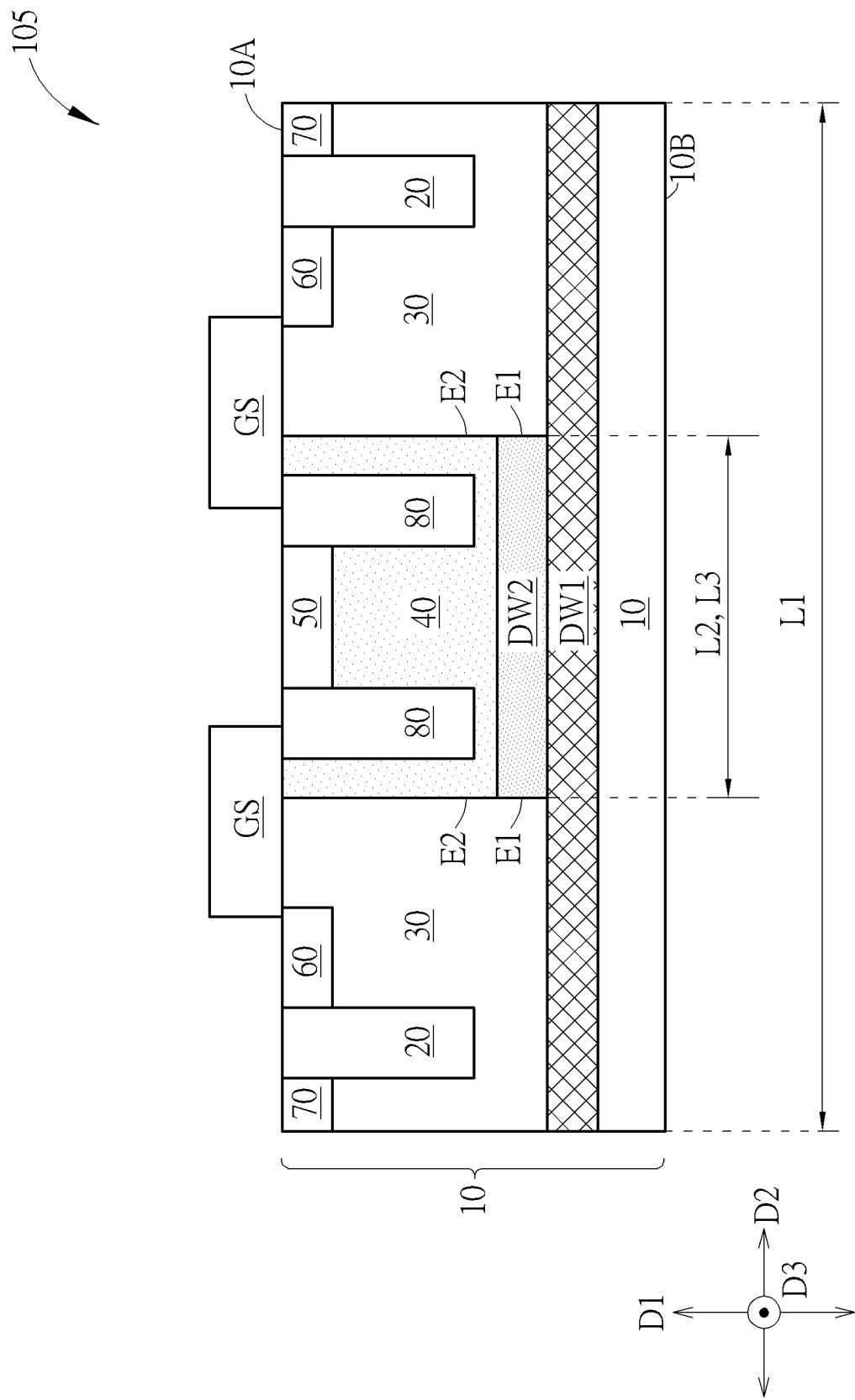
FIG. 7 is a schematic drawing illustrating a high voltage semiconductor device according to a fifth embodiment of the present invention.

Please refer to FIG. 7. FIG. 7 is a schematic drawing illustrating a high voltage semiconductor device 105 according to a fifth embodiment of the present invention. As shown in FIG. 7, in the high voltage semiconductor device 105, the second isolation structure 80 may be disposed in the semiconductor substrate 10 and located in the second well region 40, the length L2 of the second deep well region DW2 in the second direction D2 may be substantially equal to the length L3 of the second well region 40 in the second direction D2, and the two opposite edges E1 of the second deep well region DW2 in the second direction D2 may be aligned with the two opposite edges E2 of the second well region 40 in the second direction D2, respectively.

Figure 8:
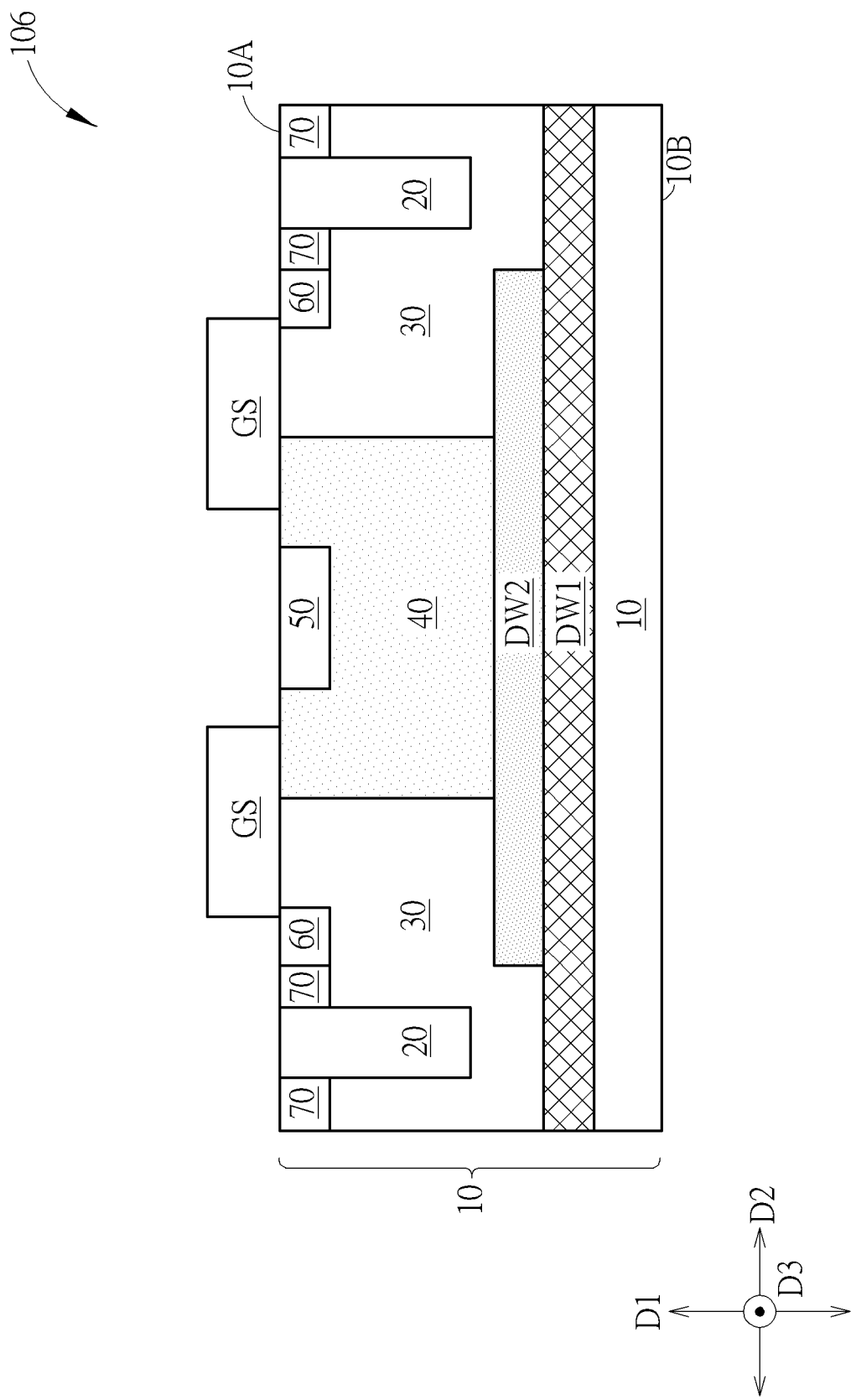
FIG. 8 is a schematic drawing illustrating a high voltage semiconductor device according to a sixth embodiment of the present invention.

Please refer to FIG. 8. FIG. 8 is a schematic drawing illustrating a high voltage semiconductor device 106 according to a sixth embodiment of the present invention. As shown in FIG. 8, in the high voltage semiconductor device 106, a part of the doped region 70 may be disposed between the source doped region 60 and the first isolation structure 20 in the second direction D2, and the doped region 70 disposed between the source doped region 60 and the first isolation structure 20 may directly connected with the source doped region 60, but not limited thereto. The electrical potential of the first well region 30 adjacent to the source doped region 60 may be adjusted more precisely by the disposition of the doped region 70 in this embodiment, and the disposition of the doped region 70 in this embodiment may be applied to other embodiments of the present invention according to some considerations.

Figure 9:
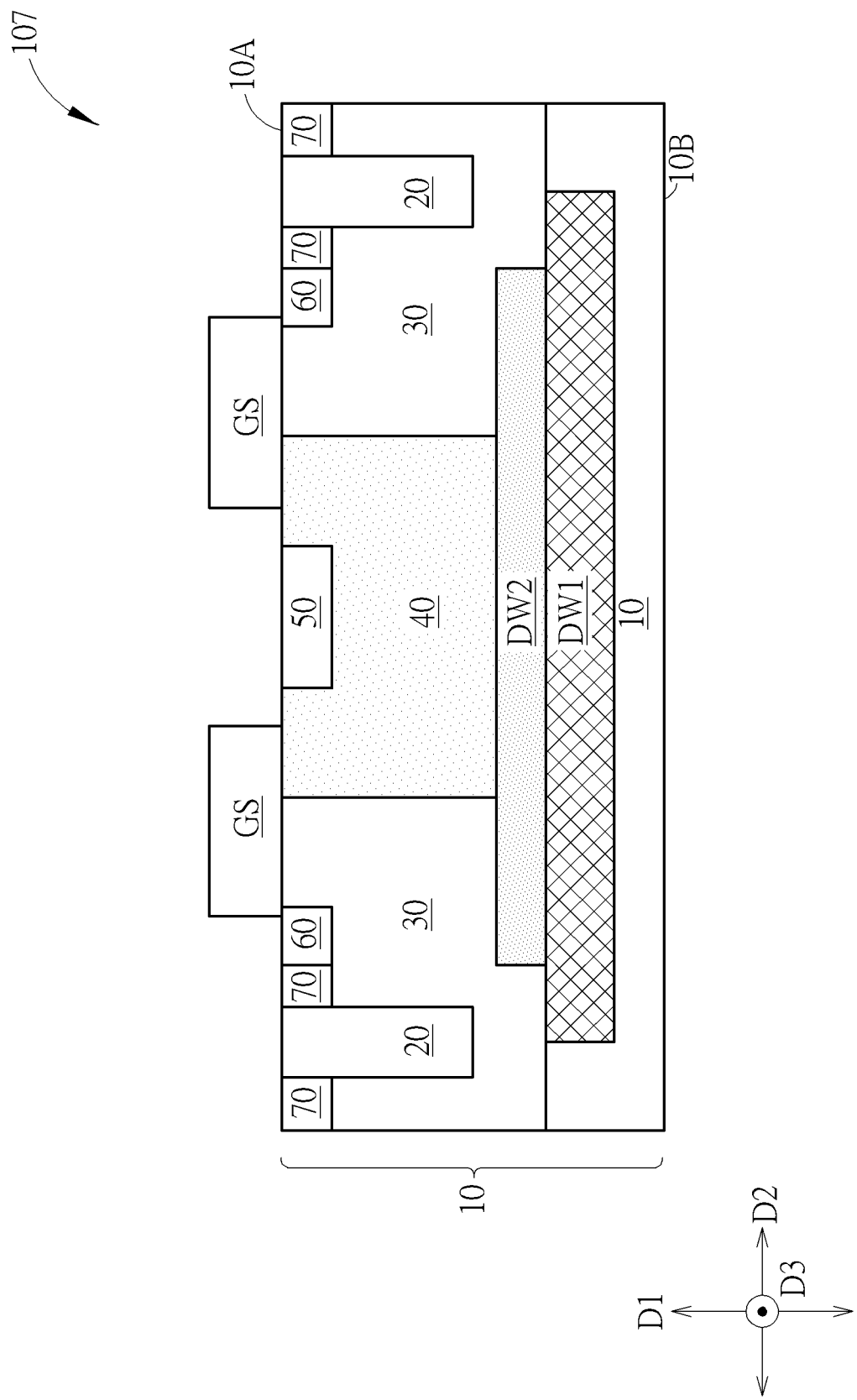
FIG. 9 is a schematic drawing illustrating a high voltage semiconductor device according to a seventh embodiment of the present invention.

Please refer to FIG. 9. FIG. 9 is a schematic drawing illustrating a high voltage semiconductor device 107 according to a seventh embodiment of the present invention. As shown in FIG. 9, in the high voltage semiconductor device 107, the first deep well region DW1 may not exceed the region corresponding to the first isolation structure 20 in the second direction D2, and the two opposite edges of the first deep well region DW1 in the second direction D2 may be located under the two first isolation structures 20 in the first direction D1 for controlling the range of the first deep well region DW1 and avoiding the negative influence of the first deep well region DW1 exceeding the region corresponding to the first isolation structure 20.

Figure 10:
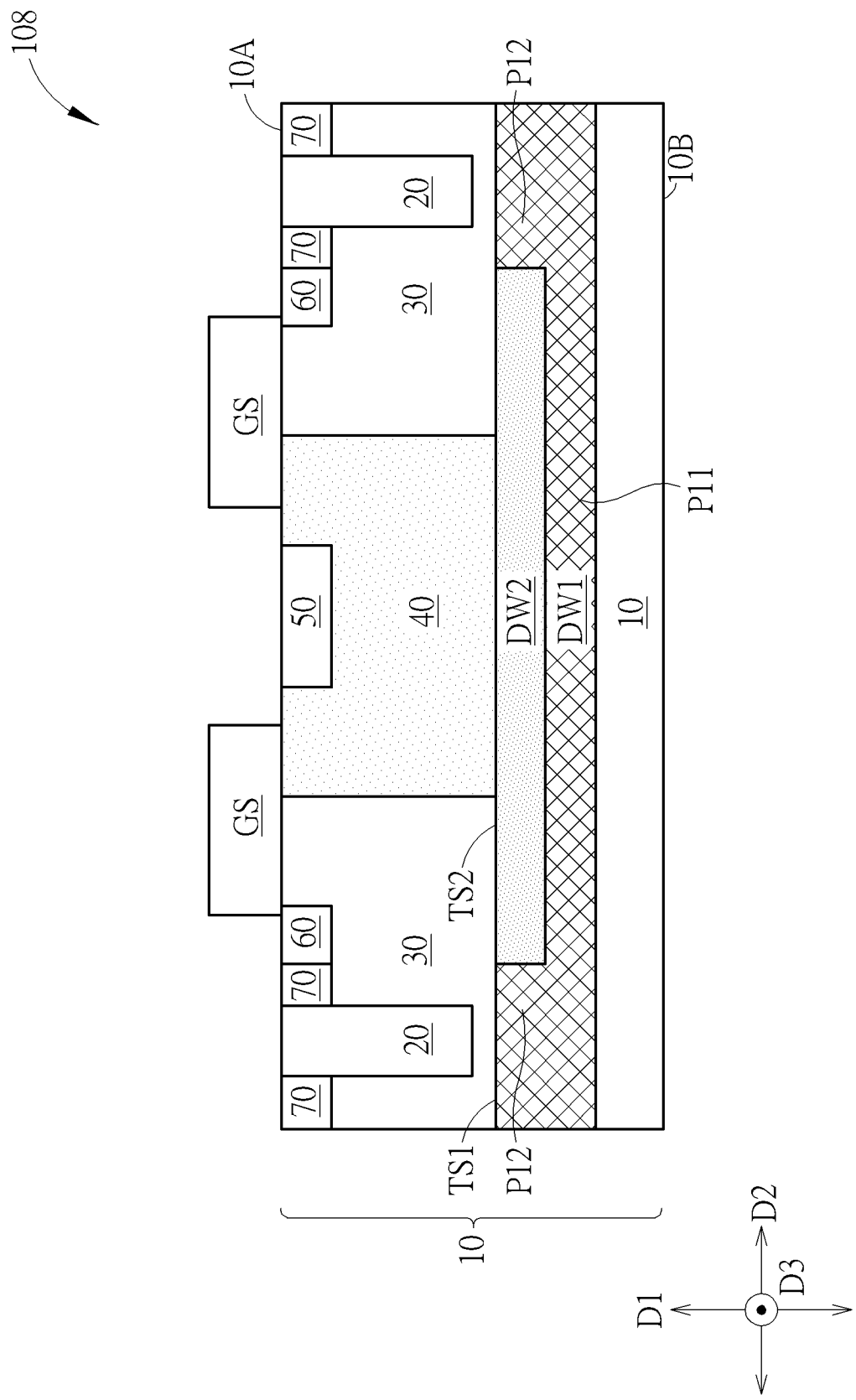
FIG. 10 is a schematic drawing illustrating a high voltage semiconductor device according to an eighth embodiment of the present invention.

Please refer to FIG. 10. FIG. 10 is a schematic drawing illustrating a high voltage semiconductor device 108 according to an eighth embodiment of the present invention. As shown in FIG. 10, in the high voltage semiconductor device 108, the first deep well region DW1 may include a first portion P11 and a second portion P12. The second portion P12 is disposed above the first portion P11, and the second portion P12 may be regarded as a protrusion part of the first deep well region DW1 in the first direction D1, but not limited thereto. In some embodiments, the second portion P12 of the first deep well region DW1 may surround the second deep well region DW2 in the horizontal direction (such as the second direction D2 and/or the third direction D3), and a top surface TS1 of the second portion P12 of the first deep well region DW1 may be higher than a top surface TS2 of the second deep well region DW2 in the first direction D1 or substantially coplanar with the top surface TS2 of the second deep well region DW2. In some embodiments, the top surface TS1 of the second portion P12 of the first deep well region DW1 may be the topmost surface of the second portion P12 in the first direction D1, and the top surface TS2 of the second deep well region DW2 may be the topmost surface of the second deep well region DW2 in the first direction D1.

Figure 11:
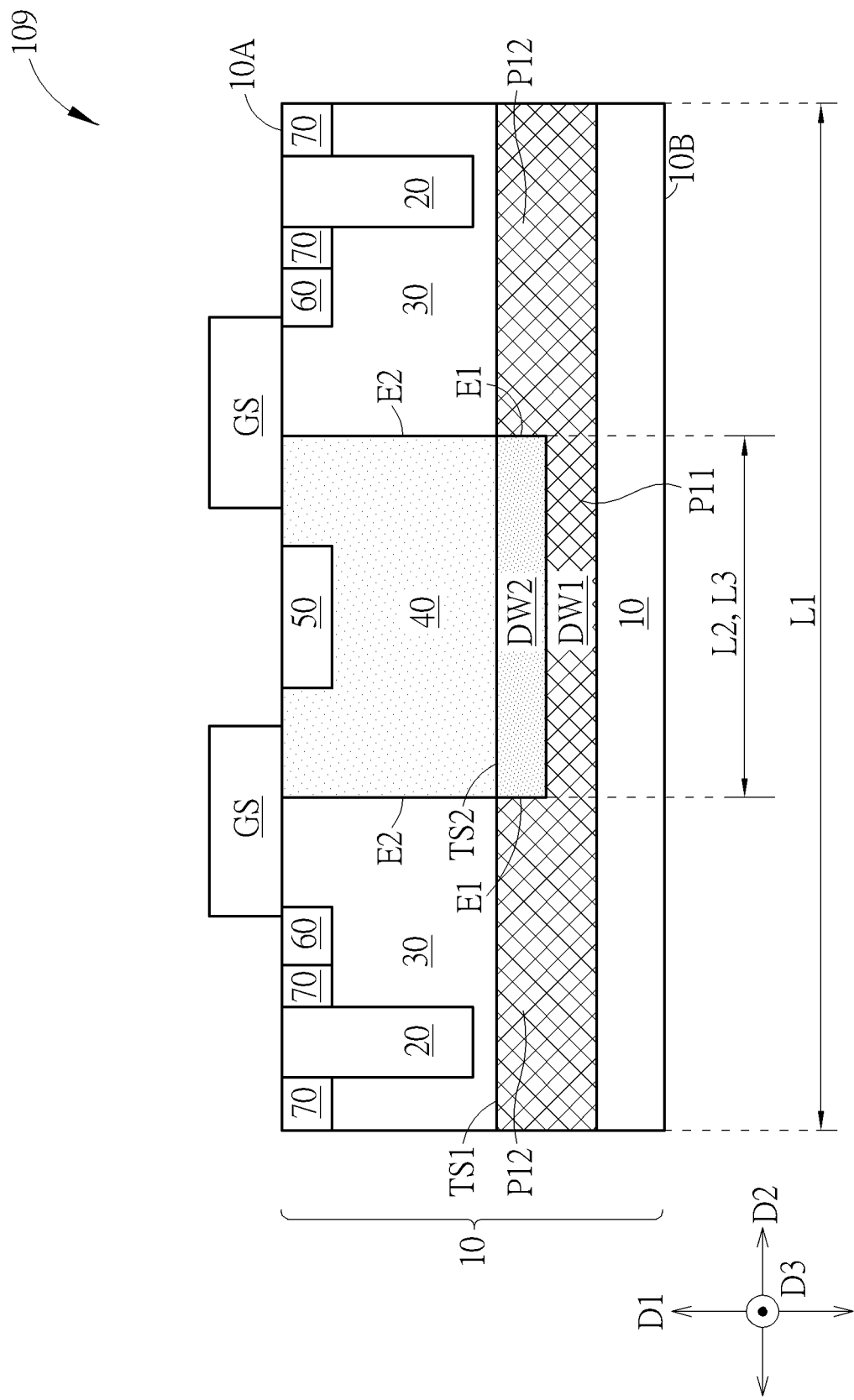
FIG. 11 is a schematic drawing illustrating a high voltage semiconductor device according to a ninth embodiment of the present invention.

Please refer to FIG. 11. FIG. 11 is a schematic drawing illustrating a high voltage semiconductor device 109 according to a ninth embodiment of the present invention. As shown in FIG. 11, in the high voltage semiconductor device 109, the second portion P12 of the first deep well region DW1 may surround the second deep well region DW2 in the horizontal direction, and the top surface TS1 of the second portion P12 of the first deep well region DW1 may be higher than the top surface TS2 of the second deep well region DW2 in the first direction D1 or substantially coplanar with the top surface TS2 of the second deep well region DW2. In addition, the length L2 of the second deep well region DW2 in the second direction D2 may be substantially equal to the length L3 of the second well region 40 in the second direction D2, and the two opposite edges E1 of the second deep well region DW2 in the second direction D2 may be aligned with the two opposite edges E2 of the second well region 40 in the second direction D2, respectively. In some embodiments, the two opposite edges E1 of the second deep well region DW2 may be covered by the second portion P12 of the first deep well region DW1, but not limited thereto.

Figure 12:
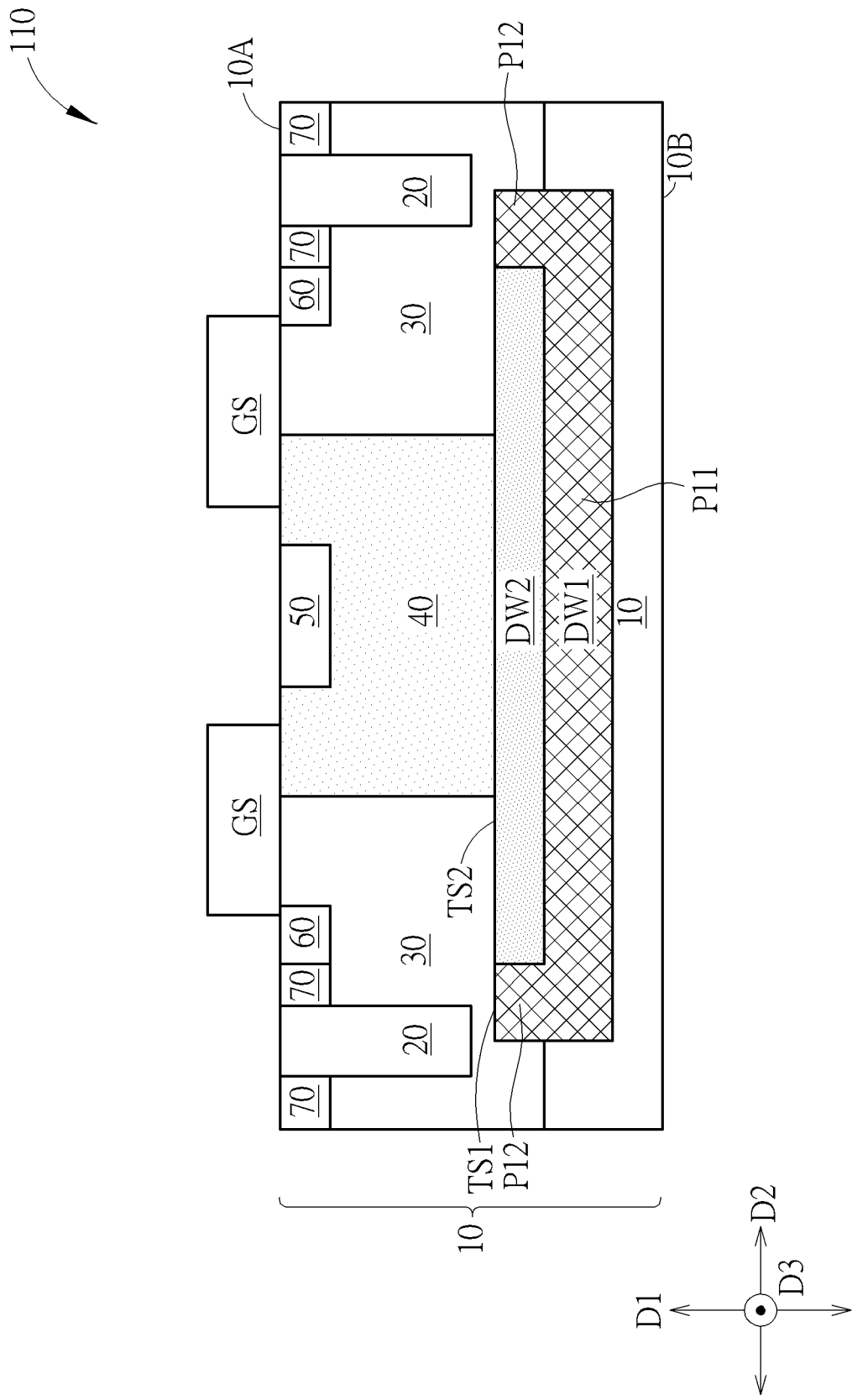
FIG. 12 is a schematic drawing illustrating a high voltage semiconductor device according to a tenth embodiment of the present invention.

Please refer to FIG. 12. FIG. 12 is a schematic drawing illustrating a high voltage semiconductor device 110 according to a tenth embodiment of the present invention. As shown in FIG. 12, in the high voltage semiconductor device 110, the second portion P12 of the first deep well region DW1 may surround the second deep well region DW2 in the horizontal direction, and the top surface TS1 of the second portion P12 of the first deep well region DW1 may be higher than the top surface TS2 of the second deep well region DW2 in the first direction D1 or substantially coplanar with the top surface TS2 of the second deep well region DW2. Additionally, the first deep well region DW1 may not exceed the region corresponding to the first isolation structure 20 in the second direction D2, and the two opposite edges of the first deep well region DW1 in the second direction D2 (such as an outer edge of the second portion P12) may be located under the two first isolation structures 20 in the first direction D1.

Figure 13:
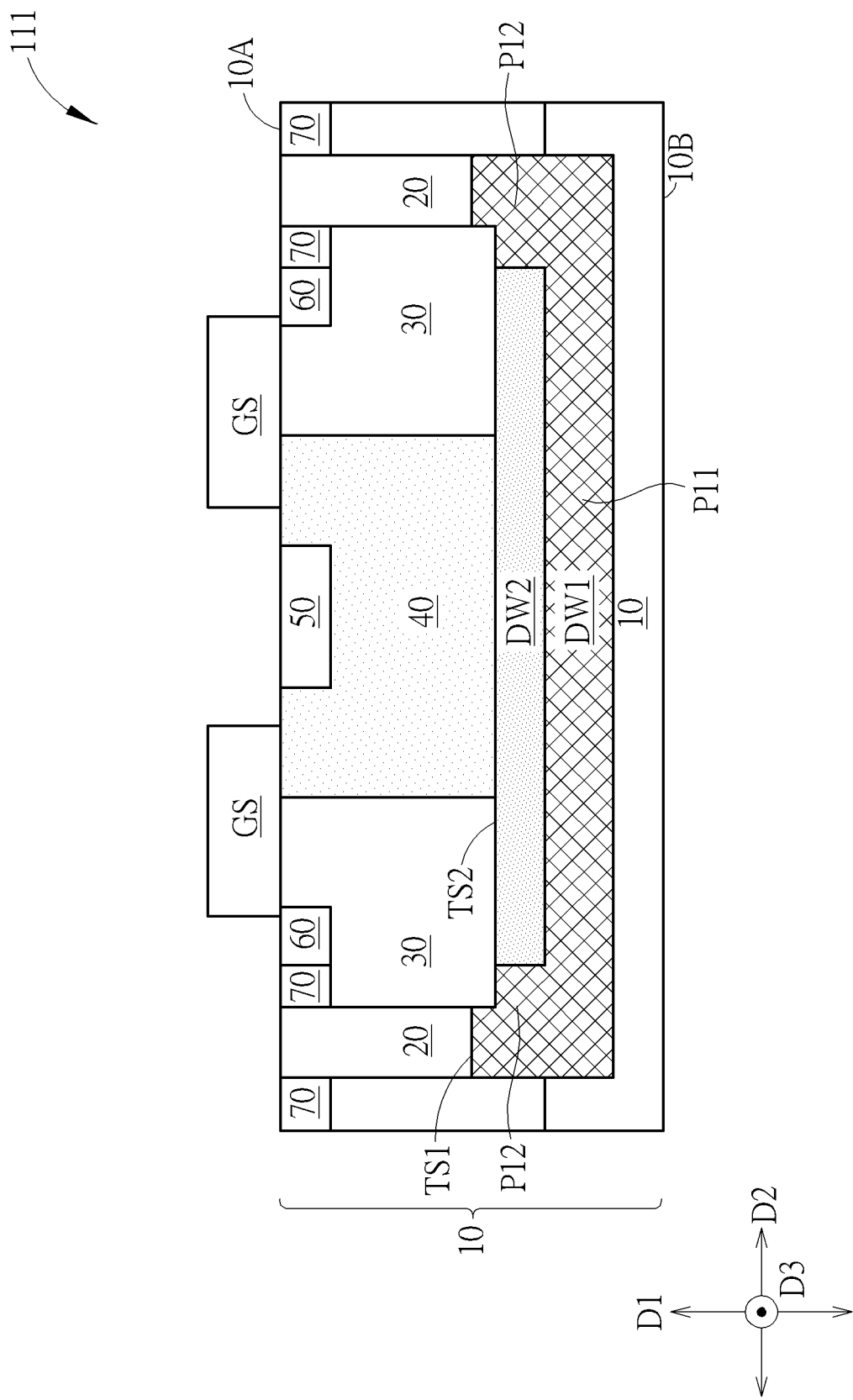
FIG. 13 is a schematic drawing illustrating a high voltage semiconductor device according to an eleventh embodiment of the present invention.

Please refer to FIG. 13. FIG. 13 is a schematic drawing illustrating a high voltage semiconductor device 111 according to an eleventh embodiment of the present invention. As shown in FIG. 13, in the high voltage semiconductor device 111, the second portion P12 of the first deep well region DW1 may surround the second deep well region DW2 in the horizontal direction, and the top surface TS1 of the second portion P12 of the first deep well region DW1 may be higher than the top surface TS2 of the second deep well region DW2 in the first direction D1. In addition, the second portion P12 of the first deep well region DW1 may be directly connected with the first isolation structure 20 for providing an isolation effect to a part of the first well region 30 (such as the first well region 30 adjacent to the source doped region 60), but not limited thereto.

Figure 14:
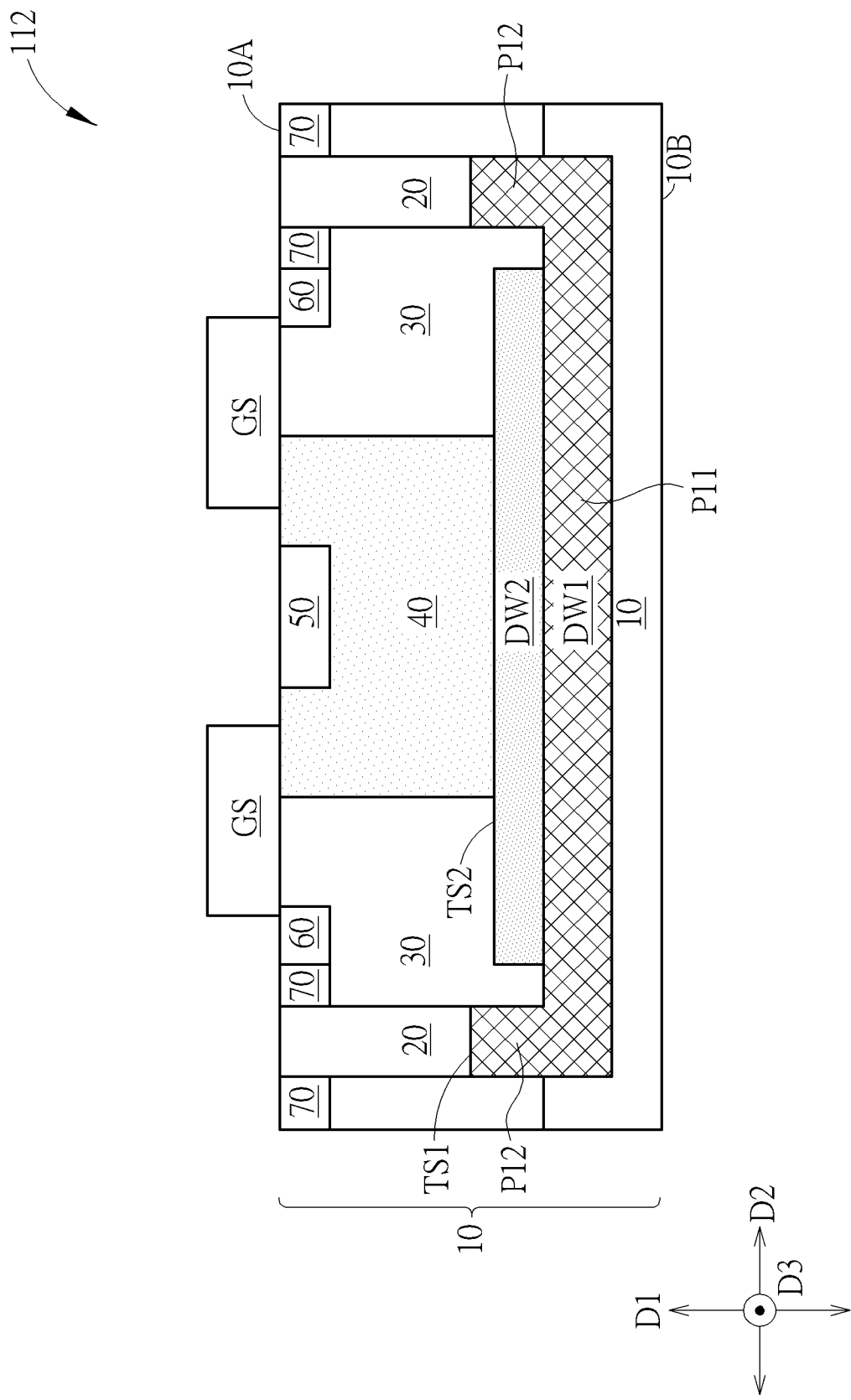
FIG. 14 is a schematic drawing illustrating a high voltage semiconductor device according to a twelfth embodiment of the present invention.

Please refer to FIG. 14. FIG. 14 is a schematic drawing illustrating a high voltage semiconductor device 112 according to a twelfth embodiment of the present invention. As shown in FIG. 14, in the high voltage semiconductor device 112, the second portion P12 of the first deep well region DW1 may surround the second deep well region DW2 in the horizontal direction, and the top surface TS1 of the second portion P12 of the first deep well region DW1 may be higher than the top surface TS2 of the second deep well region DW2 in the first direction D1. In addition, the second portion P12 of the first deep well region DW1 may be directly connected with the first isolation structure 20, and a part of the first well region 30 may be located between the second deep well region DW2 and the second portion P12 of the first deep well region DW1 in the second direction D2, but not limited thereto.

Figure 15:
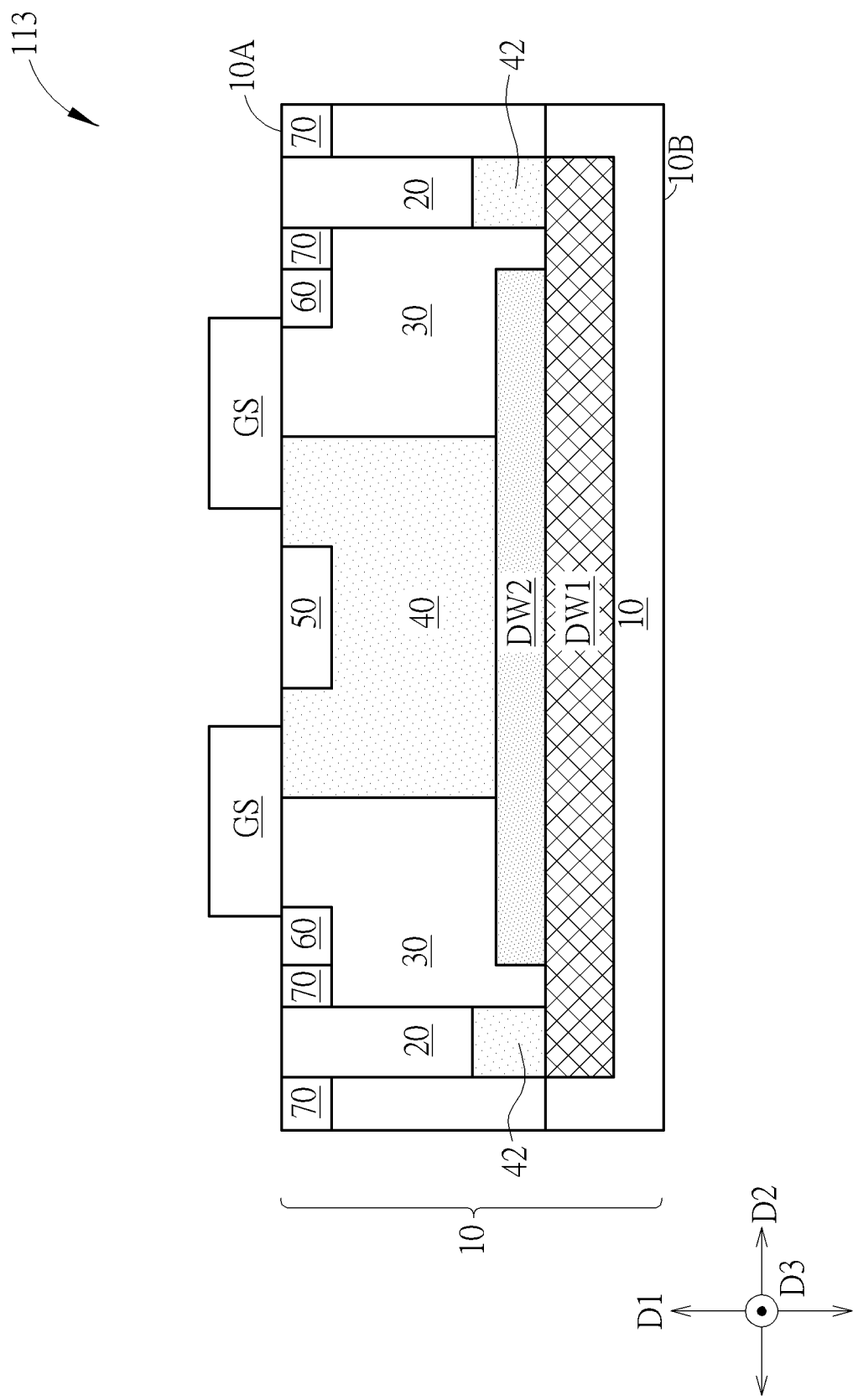
FIG. 15 is a schematic drawing illustrating a high voltage semiconductor device according to a thirteenth embodiment of the present invention.

Please refer to FIG. 15. FIG. 15 is a schematic drawing illustrating a high voltage semiconductor device 113 according to a thirteenth embodiment of the present invention. As shown in FIG. 15, the high voltage semiconductor device 113 may further include a third well region 42 disposed in the semiconductor substrate 10, and the third well region 42 may be located between the first isolation structure 20 and the first deep well region DW1 in the first direction D1. In some embodiments, the third well region 42 may be a doped well region having the second conductivity type, and the conductivity type of the third well region 42 may be complementary to the conductivity type of the first well region 30 accordingly. Additionally, the third well region 42 disposed between the first isolation structure 20 and the first deep well region DW1 may be directly connected with the first isolation structure 20 and the first deep well region DW1 respectively for providing an isolation effect to a part of the first well region 30 (such as the first well region 30 adjacent to the source doped region 60), but not limited thereto. In some embodiments, the conductivity type of the first deep well region DW1 may be identical to the conductivity type of the third well region 42, but the first deep well region DW1 and the third well region 42 may be formed by different process steps respectively, and the impurities and/or the concentration of the impurities in the third well region 42 may be different from the impurities and/or the concentration of the impurities in the first deep well region DW1 accordingly, but not limited thereto. In addition, a part of the first well region 30 may be located between the third well region 42 and the second deep well region DW2 in the second direction D2.

Figure 16:
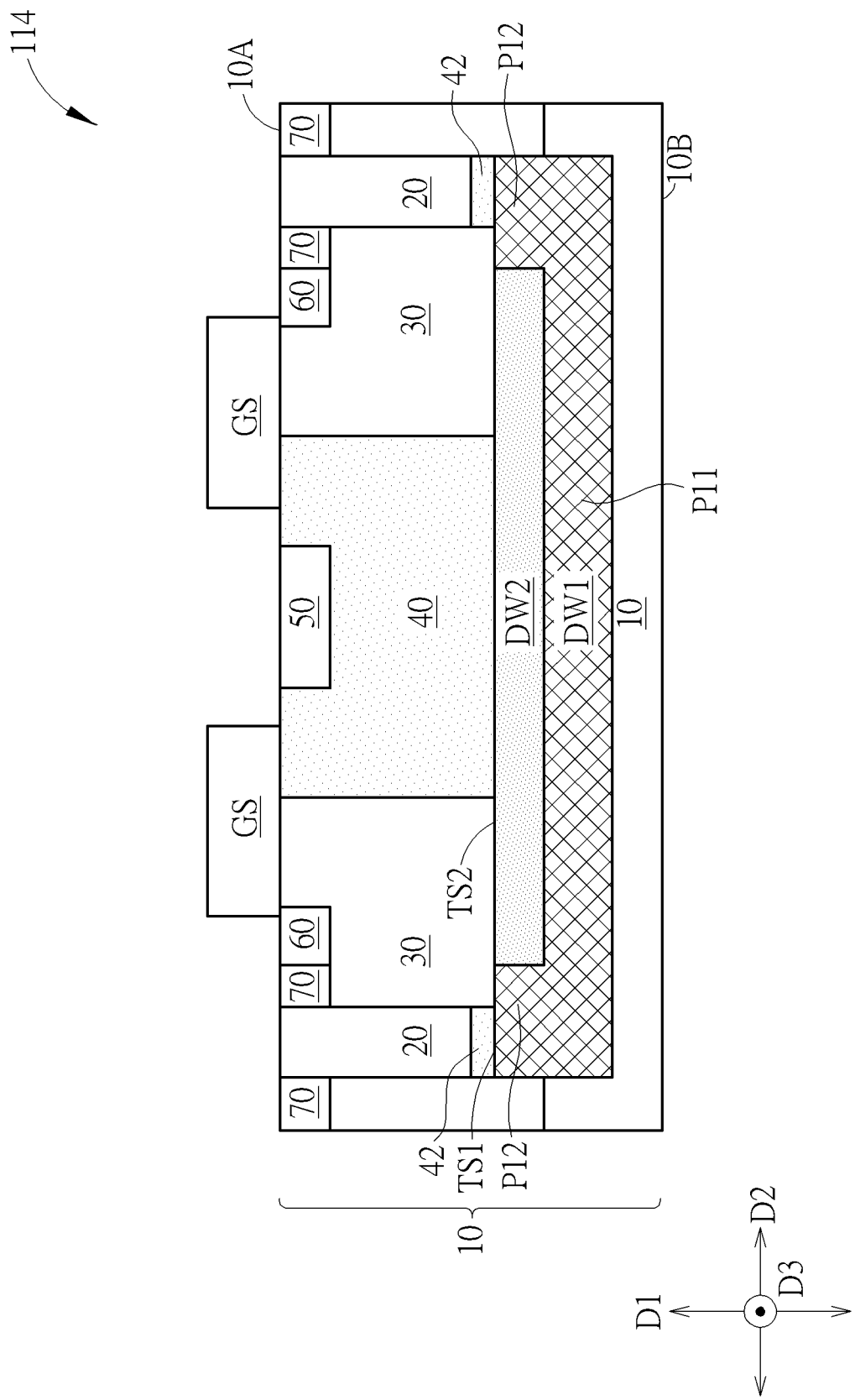
FIG. 16 is a schematic drawing illustrating a high voltage semiconductor device according to a fourteenth embodiment of the present invention.

Please refer to FIG. 16. FIG. 16 is a schematic drawing illustrating a high voltage semiconductor device 114 according to a fourteenth embodiment of the present invention. As shown in FIG. 16, in the high voltage semiconductor device 114, the second portion P12 of the first deep well region DW1 may surround the second deep well region DW2 in the horizontal direction, and the top surface TS1 of the second portion P12 of the first deep well region DW1 may be higher than the top surface TS2 of the second deep well region DW2 in the first direction D1 or substantially coplanar with the top surface TS2 of the second deep well region DW2. In addition, the third well region 42 may be located between the first isolation structure 20 and the second portion P12 of the first deep well region DW1 in the first direction D1, and the third well region 42 may be directly connected with the first isolation structure 20 and the second portion P12 of the first deep well region DW1 respectively for providing an isolation effect to a part of the first well region 30 (such as the first well region 30 adjacent to the source doped region 60), but not limited thereto.

To summarize the above descriptions, according to the high voltage semiconductor device in the present invention, the second deep well region with a range smaller than that of the first deep well region is disposed between the first deep well region and the second well region, and the first well region is be connected with the first deep well region for improving the electrical performance of the high voltage semiconductor device while the isolation effect between the semiconductor substrate and the second well region is provided by the second deep well region. For example, the on-resistance of the high voltage semiconductor device may be improved with a relatively small area occupied by the high voltage semiconductor device.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A high voltage semiconductor device, comprising:
   a semiconductor substrate;
   a first deep well region disposed in the semiconductor substrate;
   a second deep well region disposed in the semiconductor substrate and located above the first deep well region in a vertical direction, wherein a conductivity type of the second deep well region is complementary to a conductivity type of the first deep well region;
   a first well region disposed in the semiconductor substrate and located above the first deep well region in the vertical direction;
   a second well region disposed in semiconductor substrate and located above the second deep well region in the vertical direction, wherein a conductivity type of the second well region is complementary to a conductivity type of the first well region, and the conductivity type of the second well region is complementary to the conductivity type of the second deep well region;
   a gate structure disposed on the semiconductor substrate, wherein a part of the first well region and a part of the second well region are located at two opposite sides of the gate structure in a horizontal direction respectively, a length of the second deep well region in the horizontal direction is greater than or equal to a length of the second well region in the horizontal direction and less than a length of the first deep well region in the horizontal direction, and the first well region is connected with the first deep well region; and
   a first isolation structure disposed in the first well region, wherein a portion of the first well region is located between the first deep well region and the first isolation structure in the vertical direction, and a thickness of the portion of the first well region located between the first deep well region and the first isolation structure in the vertical direction is greater than a thickness of the second deep well region.

2. The high voltage semiconductor device according to claim 1, wherein the first well region is directly connected with the first deep well region and the second deep well region respectively.

3. The high voltage semiconductor device according to claim 1, wherein the first well region is directly connected with the second well region.

4. The high voltage semiconductor device according to claim 1, wherein the second deep well region is directly connected with the first deep well region and the second well region respectively.

5. The high voltage semiconductor device according to claim 1, wherein at least a part of the second deep well region is disposed between the first deep well region and the second well region in the vertical direction.

6. The high voltage semiconductor device according to claim 1, wherein two opposite edges of the second deep well region are aligned with two opposite edges of the second well region respectively.

7. The high voltage semiconductor device according to claim 1, wherein a projection area of the second well region in the vertical direction is equal to a projection area of the second deep well region in the vertical direction.

8. The high voltage semiconductor device according to claim 1, further comprising:
   a source doped region disposed in the semiconductor substrate and located in the first well region; and
   a drain doped region disposed in the semiconductor substrate and located in the second well region, wherein at least a part of the drain doped region and at least a part of the source doped region are located at the two opposite sides of the gate structure in the horizontal direction respectively.

9. The high voltage semiconductor device according to claim 8,
   wherein at least a part of the source doped region is located between the second well region and at least a part of the first isolation structure in the horizontal direction.

10. The high voltage semiconductor device according to claim 9, wherein a first portion of the first well region is located between the second well region and the first isolation structure in the horizontal direction, a first portion of the second deep well region is located between the second well region and the first deep well region in the vertical direction, and a second portion of the second deep well region is located between the first well region and the first deep well region in the vertical direction.

11. The high voltage semiconductor device according to claim 8, further comprising:
   a second isolation structure disposed in the second well region, wherein at least a part of the second isolation structure is located between the first well region and the drain doped region in the horizontal direction, and a part of the second well region is located between the second isolation structure and the second deep well region in the vertical direction.

12. The high voltage semiconductor device according to claim 1, wherein the first deep well region contains a first impurity, the second deep well region contains a second impurity, the first well region contains a third impurity, and the second well region contains a fourth impurity, wherein the first impurity and the fourth impurity are n-type impurities, and the second impurity and the third impurity are p-type impurities.

* * * * *